United States Patent
Shin et al.

(10) Patent No.: US 8,530,253 B2
(45) Date of Patent: Sep. 10, 2013

(54) METHOD OF FABRICATING FLEXIBLE DISPLAY DEVICE

(75) Inventors: Aram Shin, Seoul (KR); Tae-Joon Ahn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 148 days.

(21) Appl. No.: 13/247,398

(22) Filed: Sep. 28, 2011

(65) Prior Publication Data

US 2012/0107978 A1    May 3, 2012

(30) Foreign Application Priority Data

Oct. 30, 2010    (KR) .................. 10-2010-0107370

(51) Int. Cl.
*H01L 51/56*    (2006.01)

(52) U.S. Cl.
USPC ........ 438/29; 438/457; 438/458; 257/E33.06; 257/E33.067

(58) Field of Classification Search
USPC . 438/455, 457, 458, 22, 26, 29; 257/E33.06, 257/E33.067, E33.056, E33.058, E33.059
See application file for complete search history.

(56) References Cited

U.S. PATENT DOCUMENTS

| | | | |
|---|---|---|---|
| 6,326,279 B1 * | 12/2001 | Kakizaki et al. | 438/406 |
| 7,341,924 B2 * | 3/2008 | Takayama et al. | 438/455 |
| 8,048,770 B2 * | 11/2011 | Eguchi et al. | 438/458 |
| 8,113,914 B2 * | 2/2012 | Ohashi et al. | 451/41 |
| 2010/0291391 A1 * | 11/2010 | Okabe | 428/411.1 |

FOREIGN PATENT DOCUMENTS

| JP | H10-125931 | * 5/1998 |
|---|---|---|
| JP | 2010-225651 | * 10/2010 |

OTHER PUBLICATIONS

Machine translation, Masahara, JP 2010-225651 (translated Apr. 20, 2013) JPO and Japio, all pages.*
Machine translation, Shimoda, JP H10-125931 (translated Apr. 20, 2013) JPO and Japio, all pages.*
Machine translation, Shimoda, H10-125931 (translation date: Jul. 11, 2013), JPO & Japio, all pages.*
Machine translation, Korean patent application published as Kwon, KR 10-2008-0091964 (translation date: Jul. 13, 2013), K-PION, all pages.*

* cited by examiner

*Primary Examiner* — Fernando L Toledo
*Assistant Examiner* — Victoria K Hall
(74) *Attorney, Agent, or Firm* — Brinks Hofer Gilson & Lione (57) ABSTRACT

A method of fabricating a flexible display device includes: forming a plastic substrate on a carrier substrate, the plastic substrate including an active area and a non-active area surrounding the active area; forming an array element on the carrier substrate, the array element including a plurality of layers and having an average adhesion force among the plurality of layers; forming a first film on the array element, the first film having a first adhesion force; attaching a flexible printed circuit board to the plastic substrate; forming a second film on the first film, the second film having a second adhesion force greater than the first adhesion force; and detaching the plastic substrate from the carrier substrate.

16 Claims, 13 Drawing Sheets

*Related Art*

*FIG. 1A*

*Related Art*

*FIG. 1B*

*Related Art*

*FIG. 1C*

Related Art

METHOD OF FABRICATING FLEXIBLE DISPLAY DEVICE

This application claims the benefit of Korea Patent Application No. 10-2010-0107370, filed on Oct. 30, 2010, the entire contents of which is incorporated herein by reference for all purposes as if fully set forth herein.

BACKGROUND

1. Field of the Invention

The present disclosure relates to a method of fabricating a display device, and more particularly, to a method of fabricating an organic light emitting diode display device where a flexible substrate is easily detached from a carrier substrate without using a laser apparatus and deterioration such as lift of an organic electroluminescent diode and generation of a bubble is prevented.

2. Discussion of the Related Art

Among various flat panel display devices (FPDs), an organic light emitting diode (OLED) display device has a relatively high brightness and a relatively low driving voltage. In addition, since the OLED display device has an emissive type emitting a light for itself, the OLED display device has a relatively high contrast ratio and a relatively thin profile. The OLED display device has an advantage in displaying moving images due to a response time of several microseconds. Further, the OLED display device has no limitation in a viewing angle and has stability even at a low temperature. Since the OLED display device is driven with a low voltage of direct current (DC) 5V to DC 15V, it is easy to design and fabricate a driving circuit. Moreover, since a deposition apparatus and an encapsulation apparatus are all that is needed for fabricating the OLED display device, the fabrication process for the OLED display device is very simple.

The OLED display devices are classified into a passive matrix type and an active matrix type. In the case of the passive matrix type OLED display device, since an organic electroluminescent (EL) diode is directly connected to a scan line and a signal line that cross each other to define a pixel region in matrix, the organic EL diode emits a light of instant brightness that equals to average brightness multiplied by the number of the scan line.

In the case of the active matrix type OLED device, a switching thin film transistor (TFT) is disposed in each pixel region and a driving TFT connected to the switching TFT is connected to the organic EL diode and a power line in each pixel region. The organic EL diode includes a first electrode connected to the driving TFT, a second electrode functioning as a common electrode and an organic emitting layer between the first and second electrodes. A voltage applied to the pixel region is stored in a storage capacitor and maintained until a signal for the next frame is applied. Accordingly, the pixel region can retain the signal until the next frame regardless of the number of the scan line. Because the active matrix type OLED display device can obtain a desired luminance with low current, the active matrix type OLED display device has advantages such as low power consumption, high resolution and large size and has been widely used.

Recently, the OLED display device is being fabricated using a plastic substrate of a thickness of about 10 μm to about 200 μm as a base substrate for maximizing flexibility. However, it is hard to maintain a flat state of the plastic substrate due to flexibility while the plastic substrate is transferred between unit processes and is disposed on a stage. Accordingly, when the OLED display device is fabricated using the plastic substrate, the plastic substrate is attached to an additional carrier substrate that is hardly bent and has a flat state on the stage and the carrier substrate is detached from the plastic substrate in a subsequent process to complete the OLED display device having excellent flexibility.

Figure 1A:
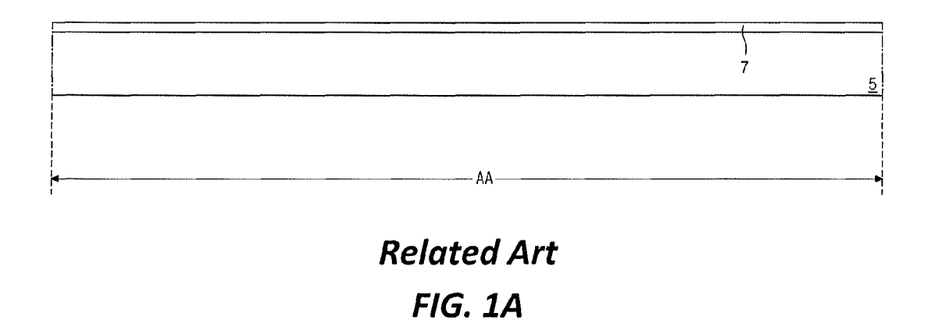
FIG. 1A to 1D are cross-sectional views showing a method of fabricating an organic light emitting diode display device according to the related art.

FIG. 1A to 1D are cross-sectional views showing a method of fabricating an organic light emitting diode display device according to the related art. In FIG. 1A, an ablation layer 7 is formed on a carrier substrate 5. The carrier substrate 5 includes a glass where a laser beam can pass. In addition, the ablation layer 7 includes hydrogenated amorphous silicon (a-Si:H) that can emit a hydrogen gas by irradiation of the laser beam to detach a plastic substrate from the carrier substrate 5.

Figure 1B:
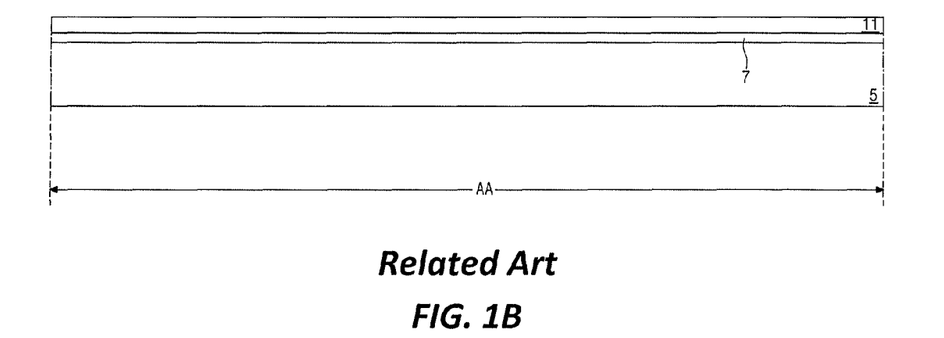
Figure 1C:
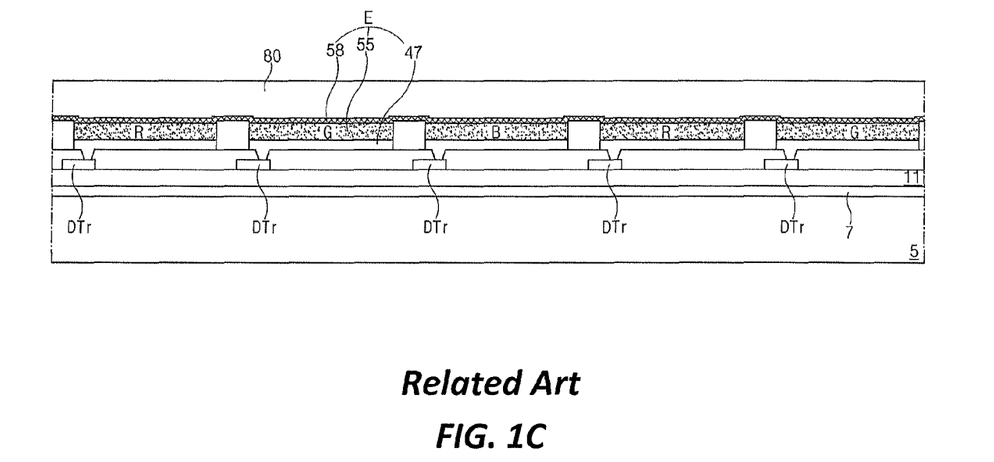

In FIG. 1B, a plastic substrate 11 is formed on the ablation layer 7 by coating and heating a plastic material of a liquid state. In FIG. 1C, a gate line (not shown), a data line (not shown), a switching thin film transistor (TFT) (not shown) and a driving TFT DTr are formed on the plastic substrate 11. In addition, an organic electroluminescent (EL) diode E, which includes a first electrode 47 connected to a drain electrode of the driving TFT DTr, an organic emitting layer 55 and a second electrode 58, is formed on the driving TFT DTr. Further, a protecting sheet 80 for protecting the organic EL diode E is formed on the organic EL diode E and a module process for attaching a driving circuit board (not shown) is attached to the plastic substrate 11.

Figure 1D:
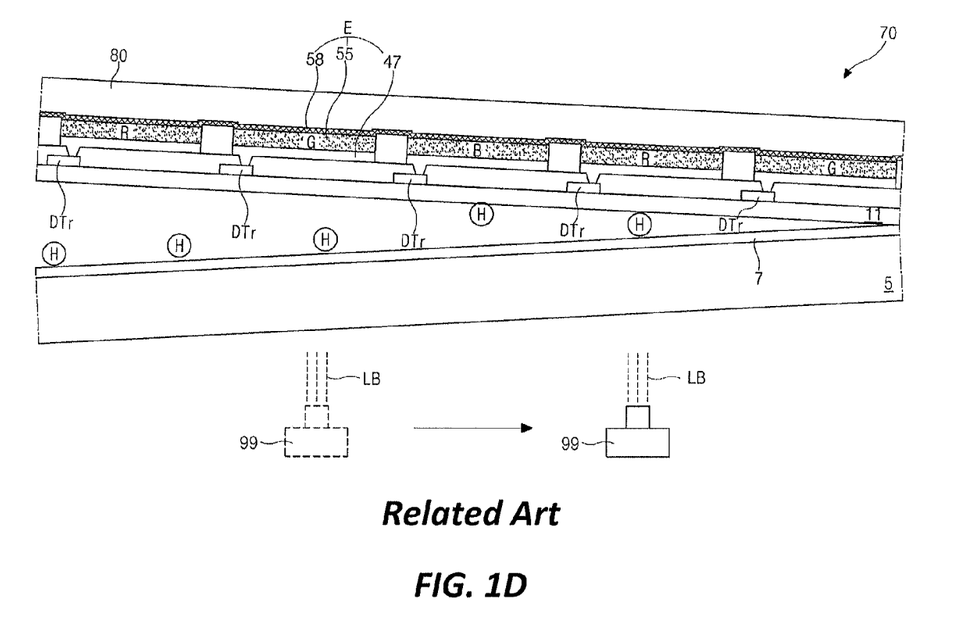

In FIG. 1D, a laser beam LB of a laser apparatus 99 is irradiated onto the ablation layer 7 through a rear surface of the carrier substrate 5. Since the hydrogen gas H of the hydrogenated amorphous silicon (a-Si:H) is erupted from the ablation layer 7, the plastic substrate 11 having the switching TFT, the driving TFT DTr and the organic EL diode E thereon is detached from the carrier substrate 5 to complete an organic light emitting diode (OLED) display device 70.

However, since the step of detaching the plastic substrate 11 from the carrier substrate 5 uses the laser apparatus 99 of a high price, the fabrication cost of the OLED display device 70 increases. In addition, since it takes about 10 minutes to about 30 minutes to detach the plastic substrate 11 from the carrier substrate 5 by irradiating the laser beam LB, productivity of making the OLED display device 70 decreases. Further, since the property of the switching TFT and the driving TFT DTr may be degraded or the gate line and the data line may be opened by the laser beam LB, production yield of the OLED display device 70 decreases.

BRIEF SUMMARY

A method of fabricating a flexible display device includes: forming a plastic substrate on a carrier substrate, the plastic substrate including an active area and a non-active area surrounding the active area; forming an array element on the carrier substrate, the array element including a plurality of layers and having an average adhesion force among the plurality of layers; forming a first film on the array element, the first film having a first adhesion force; attaching a flexible printed circuit board to the plastic substrate; forming a second film on the first film, the second film having a second adhesion force greater than the first adhesion force; and detaching the plastic substrate from the carrier substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Reference will now be made in detail to embodiments of the present invention, examples of which are illustrated in the accompanying drawings. Wherever possible, similar reference numbers will be used to refer to the same or similar parts.

Figure 2:
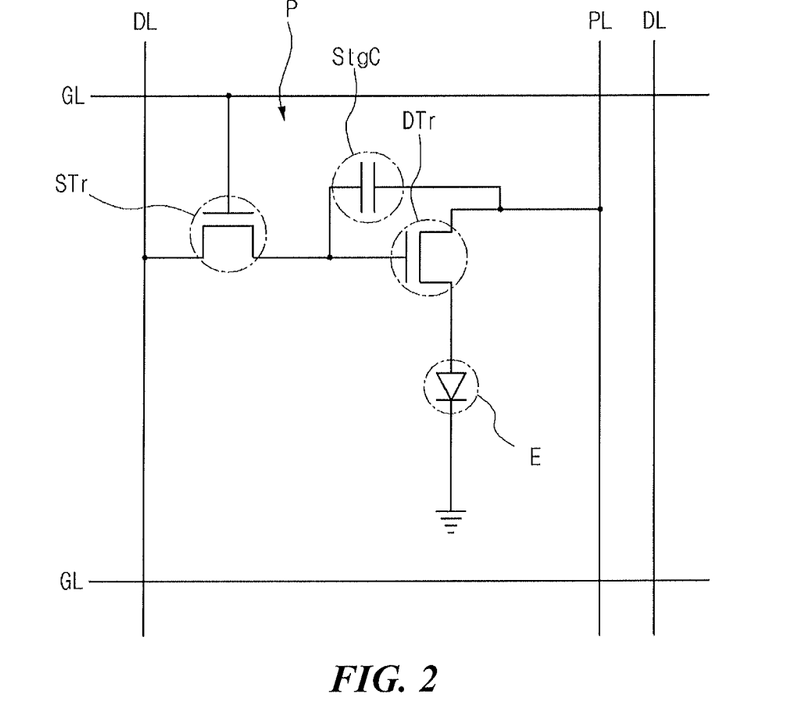
FIG. 2 is a circuit diagram showing a flexible organic light emitting diode display device according to an embodiment of the present invention.

FIG. 2 is a circuit diagram showing a flexible organic light emitting diode display device according to an embodiment of the present invention.

In FIG. 2, a gate line GL and a data line DL cross each other to define a pixel region P of a flexible organic light emitting diode (OLED) display device, and a power line PL for supplying a source voltage is parallel to and spaced apart from the data line DL. In addition, a switching thin film transistor (TFT) STr, a driving TFT DTr, a storage capacitor StgC and an organic electroluminescent (EL) diode E are formed in each pixel region P. The switching TFT STr is connected to the gate line GL and the data line DL, and the driving TFT DTr is connected to the switching TFT STr.

The driving TFT DTr and the power line PL are electrically connected to the organic EL diode E. For example, a first electrode of the organic EL diode E may be connected to a drain electrode of the driving TFT DTr, and a second electrode of the organic EL diode E may be connected to the power line PL. Further, the storage capacitor StgC is connected between a gate electrode and the source electrode of the driving TFT DTr.

When a gate signal is supplied to the gate line GL, the switching TFT STr is turned on and a data signal of the data line DL is applied to the gate electrode of the driving TFT DTr. As a result, the driving TFT DTr is turned on and the source voltage of the power line PL is supplied to the organic EL diode E so that the organic EL diode E can emit a light. Here, when the driving TFT DTr has an ON state, a level of a current flowing through the organic EL diode E is determined according to the ON state of the driving TFT DTr so that the organic EL diode E can display a gray scale.

When the switching TFT STr is turned off, the storage capacitor StgC functions to keep a gate voltage of the driving TFT DTr constant. Accordingly, the level of the current flowing through the organic EL diode E is kept constant until the next frame even when the switching TFT STr is turned off.

FIGS. 3A to 3K are cross-sectional views showing a method of fabricating a flexible organic light emitting diode display device according to an embodiment of the present invention, and FIGS. 4A to 4D are plan views showing a method of fabricating a flexible organic light emitting diode display device according to an embodiment of the present invention. For the convenience of illustration, FIGS. 3A to 3G show an active area AA displaying an image, and FIGS. 3H to 3K show an active area AA and a non-active area NA surrounding the active area.

Figure 3A:
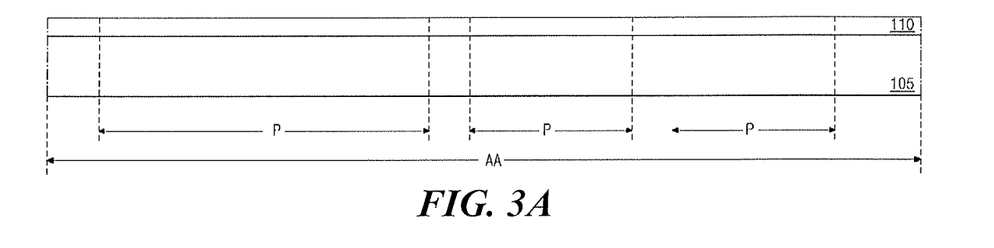
FIGS. 3A to 3K are cross-sectional views showing a method of fabricating a flexible organic light emitting diode display device according to an embodiment of the present invention.
Figure 4A:
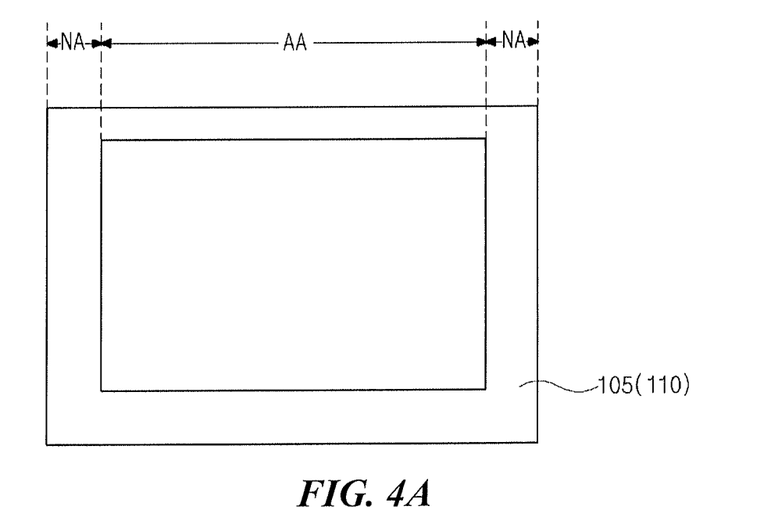
FIGS. 4A to 4D are plan views showing a method of fabricating a flexible organic light emitting diode display device according to an embodiment of the present invention.

In FIGS. 3A and 4A, after a plastic layer (not shown) may be formed on a carrier substrate 105 by coating a liquid plastic material, the plastic layer may be cured through a heat treatment to form a plastic substrate 110 having a pixel region P. For example, the carrier substrate may include a glass and the liquid plastic material may include a polyimide. Alternatively, the plastic substrate 110 may be formed on the carrier substrate 105 by attaching a film type plastic sheet. The plastic substrate 110 may have a thickness of about 10 μm to about 100 μm.

Although not shown, before the plastic substrate 110 is formed on the carrier substrate 105, an adhesion mitigating layer may be formed on an entire surface of the carrier substrate 105 to easily separate the plastic substrate 110 and the carrier substrate 105 in a subsequent step. For example, the adhesion mitigating layer may include an inorganic material such as silicon oxide (SiO2) and silicon nitride (SiNx) such that an adhesion force between the plastic substrate 110 and the adhesion mitigating layer is smaller than an adhesion force between the plastic substrate 110 and the carrier substrate 105.

Further, an adhesion reinforcing layer having a lattice shape or a rectangular ring shape surrounding the display area may be formed on the adhesion mitigating layer to prevent deterioration such as a misalignment due to detachment of the plastic substrate 110 while the plastic substrate 110 is transferred between unit processes or a unit process is performed. For example, the adhesion reinforcing layer may include one of molybdenum (Mo), molybdenum alloy such as molybdenum tungsten (MoW) and molybdenum titanium (MoTi), aluminum (Al), aluminum alloy such as aluminum neodymium (AlNd), copper (Cu), amorphous indium-tin-oxide (a-ITO) and indium-gallium-zinc-oxide (IGZO).

Figure 3B:
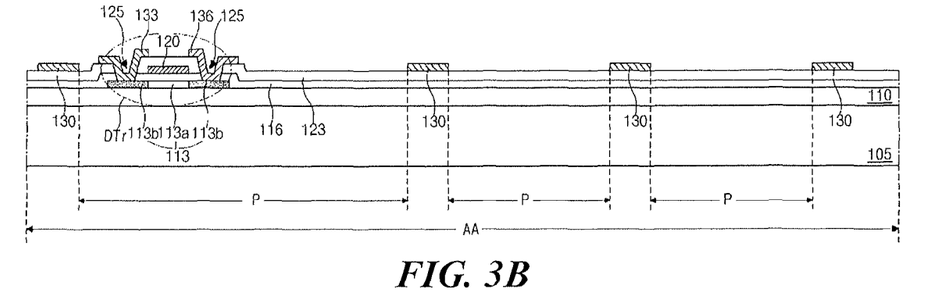

In FIG. 3B, an amorphous silicon layer (not shown) is formed on the plastic substrate 110 and the amorphous layer is crystallized by irradiation of a laser beam or a heat to form a polycrystalline silicon layer (not shown). The polycrystalline silicon layer is patterned through a photolithographic process to form a semiconductor layer 113 of intrinsic polycrystalline silicon.

A gate insulating layer 116 of an inorganic insulating material such as silicon oxide (SiO2) is formed on the semiconductor layer 113. A first metal layer (not shown) is formed on the gate insulating layer 116 and the first metal layer is patterned through a photolithographic process to form a gate electrode 120 corresponding to the semiconductor layer 113. At the same time, a gate line (not shown) connected to a gate electrode of a switching thin film transistor (TFT) (not shown) and a gate pad at one end of the gate line are formed on the gate insulating layer 116. For example, the first metal layer may include one of aluminum (Al), aluminum alloy such as aluminum neodymium (AlNd), copper (Cu), copper alloy and chromium (Cr).

The semiconductor layer 113 is doped with impurities using the gate electrode 120 as a doping mask to form a first region 113a of intrinsic polycrystalline silicon and a second region 113b of impurity-doped polycrystalline silicon. The first region 113a corresponds to the gate electrode 120 and the second region 113b is exposed outside the gate electrode 120. For example, the impurities may include one of Group III element and Group V element.

An interlayer insulating layer 123 is formed on the semiconductor layer 113 having the first and second regions 113a and 113b. The interlayer insulating layer 123 may include an inorganic insulating material such as silicon oxide (SiO2) and silicon nitride (SiNx). The interlayer insulating layer 123 and the gate insulating layer 116 are patterned through a photolithographic process to form a semiconductor contact hole 125 exposing the second region 113b of the semiconductor layer 113.

A second metal layer (not shown) is formed on the interlayer insulating layer 123 and the second metal layer is patterned through a photolithographic process to form source and drain electrodes 133 and 136 connected to the second region 113b through the semiconductor contact hole 125. For example, the second metal layer may include one of aluminum (Al), aluminum alloy such as aluminum neodymium (AlNd), copper (Cu), copper alloy, chromium (Cr) and molybdenum (Mo). At the same time, a data line 130 connected to a source electrode of the switching TFT, a data pad at one end of the data line 130 and a power line (not shown) parallel to and spaced apart from the data line 130 are formed on the interlayer insulating layer 123. The data line 130 crosses the gate line to define the pixel region P.

The semiconductor layer 113, the gate electrode 120, the source electrode 133 and the drain electrode 136 constitute as driving TFT DTr. Although not shown, the switching TFT has the same structure as the driving TFT DTr.

Figure 3C:
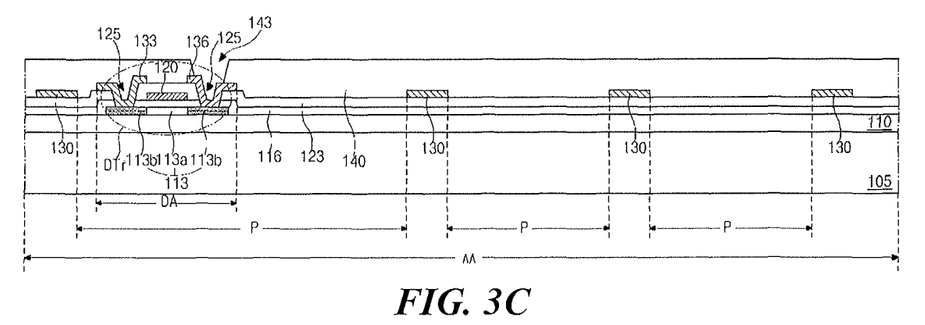

In FIG. 3C, a passivation layer 140 is formed on the source and drain electrodes 133 and 136 and the passivation layer 140 is patterned through a photolithographic process to form a drain contact hole 143 exposing the drain electrode 136 of the driving TFT DTr. For example, the passivation layer 140 may include one of an inorganic insulating material such as silicon oxide (SiO2) and silicon nitride (SiNx) and an organic insulating material such as acrylic resin and benzocyclobutene (BCB).

Figure 3D:
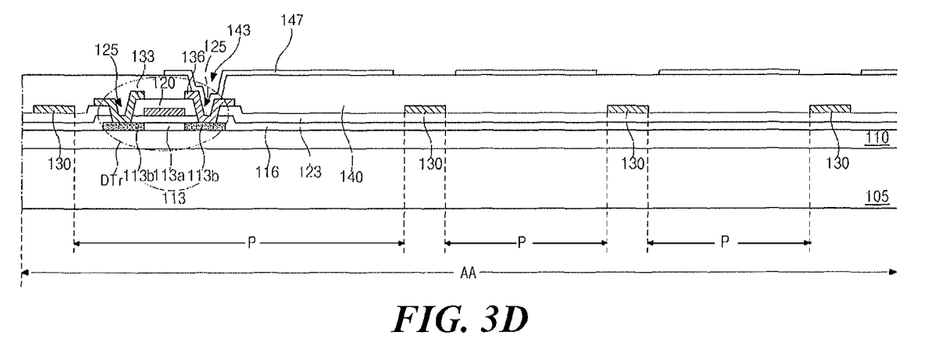

In FIG. 3D, a first electrode 147 connected to the drain electrode 136 through the drain contact hole 143 is formed on the passivation layer 140. The first electrode 147 may have a single-layered structure or a double-layered structure. For example, the first electrode 147 of a single-layered structure may include a transparent conductive material such as indium-tin-oxide (ITO) and indium-zinc-oxide (IZO) having a thickness of several thousands A. In addition, the first electrode 147 of a double-layered structure may have a lower layer of a reflective metallic material such as aluminum (Al), aluminum alloy such as aluminum neodymium (AlNd) and silver (Ag) and an upper layer of a transparent conductive material such as indium-tin-oxide (ITO) and indium-zinc-oxide (IZO).

Figure 3E:
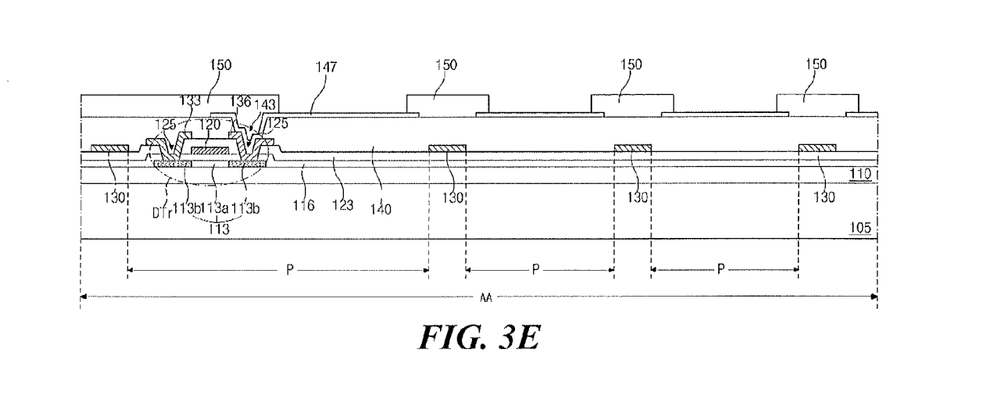
Figure 3F:
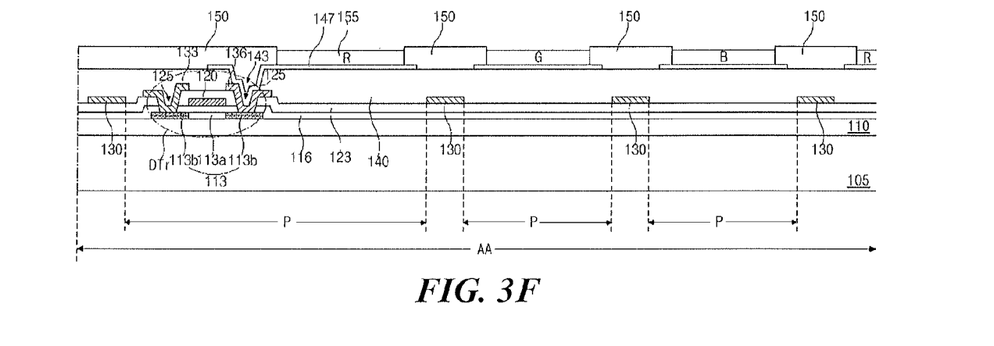

In FIG. 3E, a bank layer 150 is formed on the first electrode 147 by depositing and patterning an organic insulating material such as acrylic resin and benzocyclobutene (BCB). The bank layer 150 may surround the pixel region and may cover a boundary portion of the first electrode 147. In addition, in FIG. 3F, an organic emitting layer 155 is formed on the first electrode 147 exposed through the bank layer 150. The organic emitting layer 155 may be formed by thermally depositing an organic emitting material using a shadow mask. Although the organic emitting layer 155 has a single-layered structure in FIG. 3E, the organic emitting layer 155 may have a multiple-layered structure including a hole injection layer, a hole transporting layer, an emitting material layer, an electron transporting layer and an electron injection layer in another embodiment for improving an emission efficiency. Further, the organic emitting layer 155 in the pixel region P may emit one of red (R), green (G) and blue (B) colored lights.

Figure 3G:
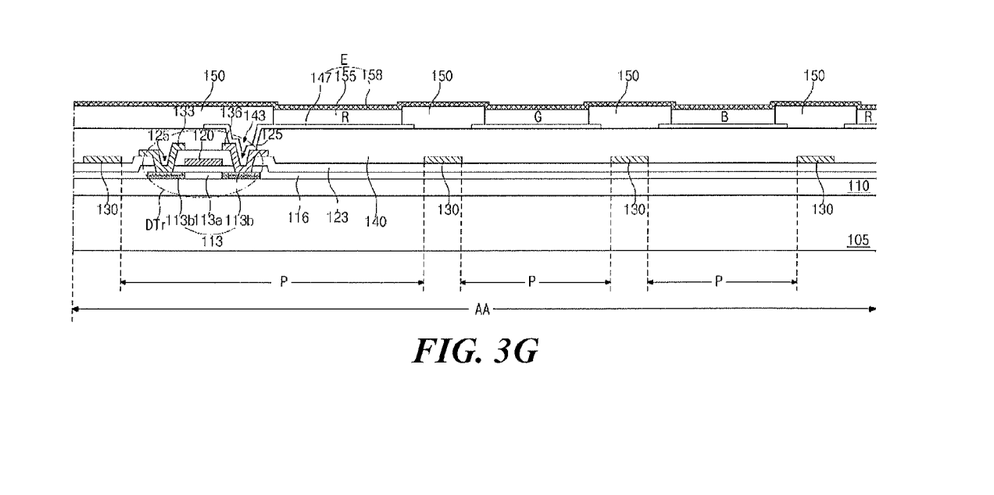

In FIG. 3G, a second electrode 158 is formed on the organic emitting layer 155. The second electrode 158 may include a metallic material such as aluminum (Al), aluminum alloy (e.g., aluminum neodymium (AlNd)), silver (Ag), magnesium (Mg), gold (Au), aluminum magnesium (AlMg) and magnesium silver (MgAg). The metallic material of the second electrode 158 may have a work function smaller than the transparent conductive material of the first electrode 147. In addition, the second electrode 158 may be formed in the whole active area AA. The first electrode 147, the organic emitting layer 155 and the second electrode 158 in the pixel region constitute an organic electroluminescent (EL) diode E.

Figure 3H:
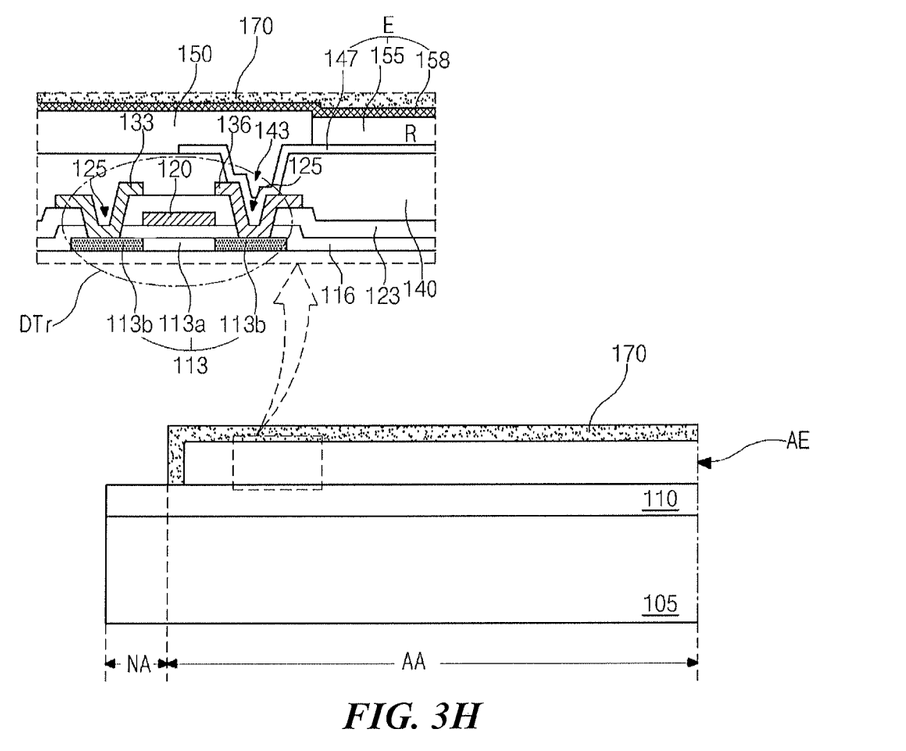
Figure 4B:
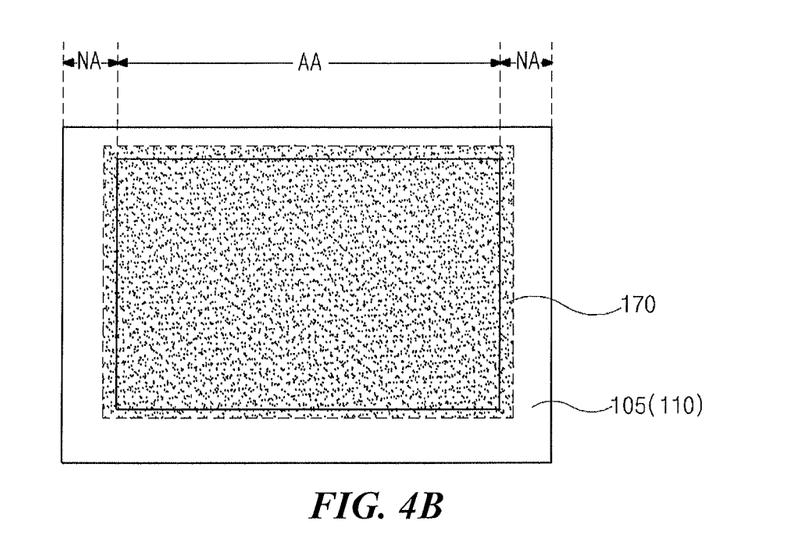

In FIGS. 3H and 4B, a first film 170 is formed on an array element AE including a plurality of layers such as the switching TFT, the driving TFT DTr and the organic EL diode E. The first film 170 may include one of polyimide (PI), polystyrene (PS), polyethylene terephthalate (PET), polyethylene naphthalate (PEN) and polyether sulfone (PES). The first film 170 may cover the whole active area AA and a portion of the non-active area NA to expose the gate pad and the data pad. In addition, a first adhesion force between the first film 170 and the array element AE may be similar to an adhesion force between the second electrode 158 and the organic emitting layer 155 of a single-layered structure or an average adhesion force among the organic emitting layer 155 of a multiple-layered structure. For example, when the organic emitting layer 155 has a multiple-layered structure, the first adhesion force between the first film 170 and the second electrode 158 of the organic EL diode E is about 0.9 times to about 1.1 times of the average adhesion force (i.e., a reference adhesion force) among the layers of the organic emitting layer 155 of a multiple-layered structure.

The first film 170 is used for protecting the organic EL diode E and preventing detachment among layers of the organic EL diode E. Further, the first film 170 is used for supporting the plastic substrate 110 and the array element AE without generation of bubbles between the first film 170 and the array element AE. The organic emitting layer 155 and the second electrode 158 may be formed through a thermal deposition method. In addition, the passivation layer 140 may be formed of an inorganic insulating material through a chemical vapor deposition (CVD) method or formed of an inorganic insulating material through a coating and hardening method, and the gate line, the data line 130 and the first electrode 147 are formed of a metallic material through a physical vapor deposition (PVD) method such as a sputtering method. Since elements of a layer by a thermal deposition method are less dense than elements of a layer by a CVD method, a coating and hardening method or a PVD method, an adhesion force of the organic emitting layer 155 and the second electrode 158 is smaller than an adhesion force of the passivation layer 140, the gate line, the data line 130 and the first electrode 147.

When a stronger film having a greater adhesion force as compared with an adhesion force between the layers of the organic EL diode E (i.e., an adhesion force greater than about 1.1 times of the reference adhesion force) is formed on the organic EL diode E, the layers of the organic EL diode E may be detached from each other due to the stronger film while the plastic substrate 110 is bent by stress in a subsequent separation step of the plastic substrate 110 and the carrier substrate 105. In addition, when a weaker film having an adhesion force smaller than about 0.9 times of the reference adhesion force (e.g., a typical protecting film having an adhesion force of about 0.3 times to about 0.6 times of the reference adhesion force) is formed on the organic EL diode E, the weaker film may be pushed and a bubble may be generated between the weaker film and the organic EL diode E in the subsequent separation step of the plastic substrate 110 and the carrier substrate 105.

Accordingly, deterioration such as detachment of the layers of the organic EL diode E and generation of the bubble on the organic EL diode E are prevented by forming the first film 170 having a first adhesion force of about 0.9 times to about 1.1 times of the average adhesion force among the layers of the organic EL diode E on the organic EL diode E.

Figure 3I:
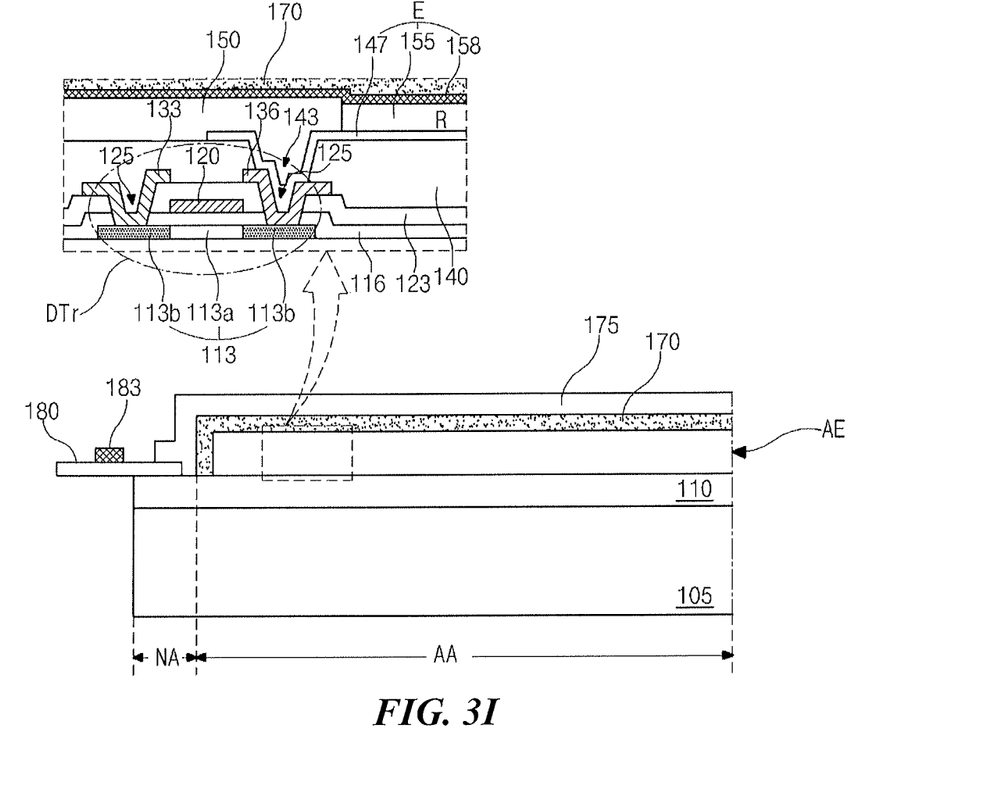
Figure 4C:
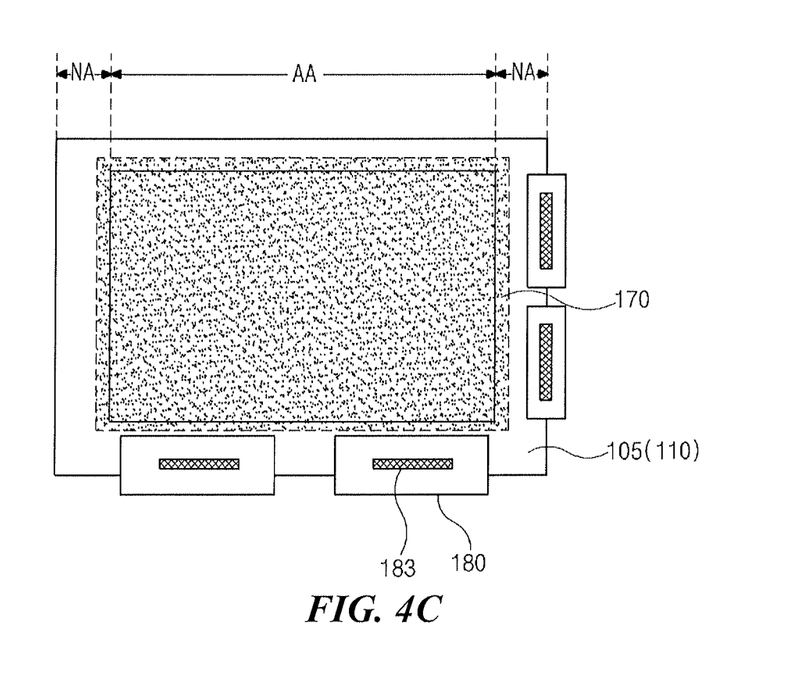

In FIGS. 3I and 4C, one end of a flexible printed circuit board (FPCB) 180 having a driving integrated circuit (IC) 183 is attached to the gate pad and the data pad in the non-active area NA exposed outside the first film 170. Although not shown, the other end of the FPCB 180 may be attached to a printed circuit board (PCB).

Figure 4D:
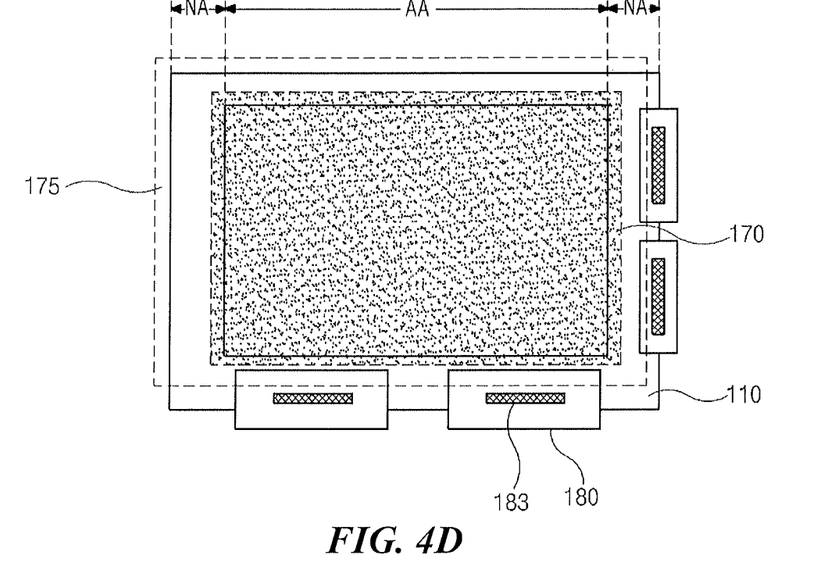

In FIGS. 3I and 4D, a second film 175 is formed on the first film 170. The second film 175 may cover the whole first film 170 and a portion of the FPCB 180. For example, an end of the second film 175 may be disposed outside an end portion of the plastic substrate 110 where the FPCB 180 is not attached and another end of the second film 175 may be disposed inside another end portion of the plastic substrate 110 to overlap a portion of the FPCB 180. The second film 175 may have a second adhesion force greater than the first adhesion force similar to the reference adhesion force and an adhesion force between the plastic substrate 110 and the carrier substrate 105. For example, the adhesion force between the plastic substrate 110 and the carrier substrate 105 may be about 2 times to about 3 times of the reference adhesion force, and the second adhesion force between the second film 175 and the first film 170 and between the second film 175 and the plastic substrate 110 may be about 3 times to about 5 times of the reference adhesion force.

The second film 175 is used for detaching the plastic substrate 110 from the carrier substrate 105 easily. Further, the second film 175 is used for supporting the whole active area AA stably and handling the plastic substrate 110 easily when the plastic substrate 110 is transferred. Moreover, the second film 175 is used for preventing push of the first film 170 more stably.

For example, the second film 175 may be a polarizing plate that selectively transmits a polarized light having a predetermined polarization axis and blocks the other light. The polarizing plate improves brightness at a front viewing angle and visibility of the flexible OLED display device and prevents glare due to reflection of exterior light. Accordingly, when the second film 175 of a polarizing plate is formed on the first film 170, brightness and visibility of the flexible OLED display device are improved because the light from the organic emitting layer 155 is focused toward the front viewing angle by the second film 175.

Figure 3J:
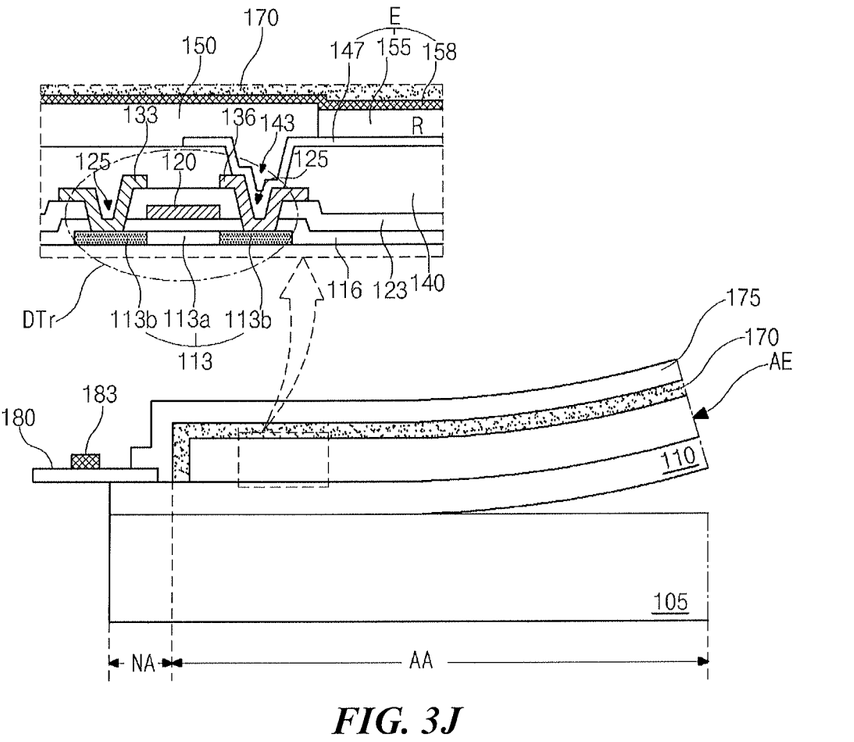

In FIG. 3J, the plastic substrate is detached from the carrier substrate 105. After the one end of the second film 175 outside the end portion of the non-active area NA is vacuum adsorbed or the one end of the second film 175 outside the end portion of the non-active area NA is grasped by a clamp, a force may be slowly applied to the carrier substrate 105 so that the plastic substrate 110 and the carrier substrate 105 can be slowly separated from each other. The separation of the plastic substrate 110 and the carrier substrate 105 may be manually performed without using equipment such as a clamp.

Since the second adhesion force between the second film 175 and the first film 170 and between the second film 175 and the plastic substrate 110 is greater than the adhesion force between the plastic substrate 110 and the carrier substrate 105, the second film 175 is not separated from the plastic substrate 110 even while the plastic substrate 110 is detached from the carrier substrate 105 using the end of the second film 175 outside the non-active area NA.

Figure 3K:
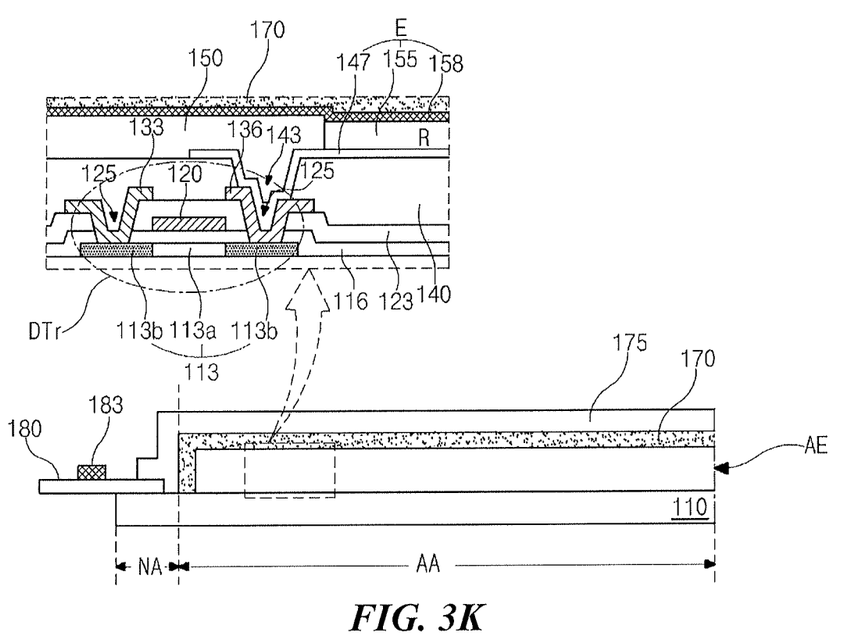

In FIG. 3K, the plastic substrate 110 having the array element AE and the FPCB 180 covered with the first and second films 170 and 175 is obtained by eliminating the carrier substrate 105. A portion of the second film 175 outside the plastic substrate 110 may be cut to be eliminated or the second film 175 and the plastic substrate 110 may be cut to obtain the non-active area NA of a predetermined width, thereby the flexible OLED display device completed.

Figure 5:
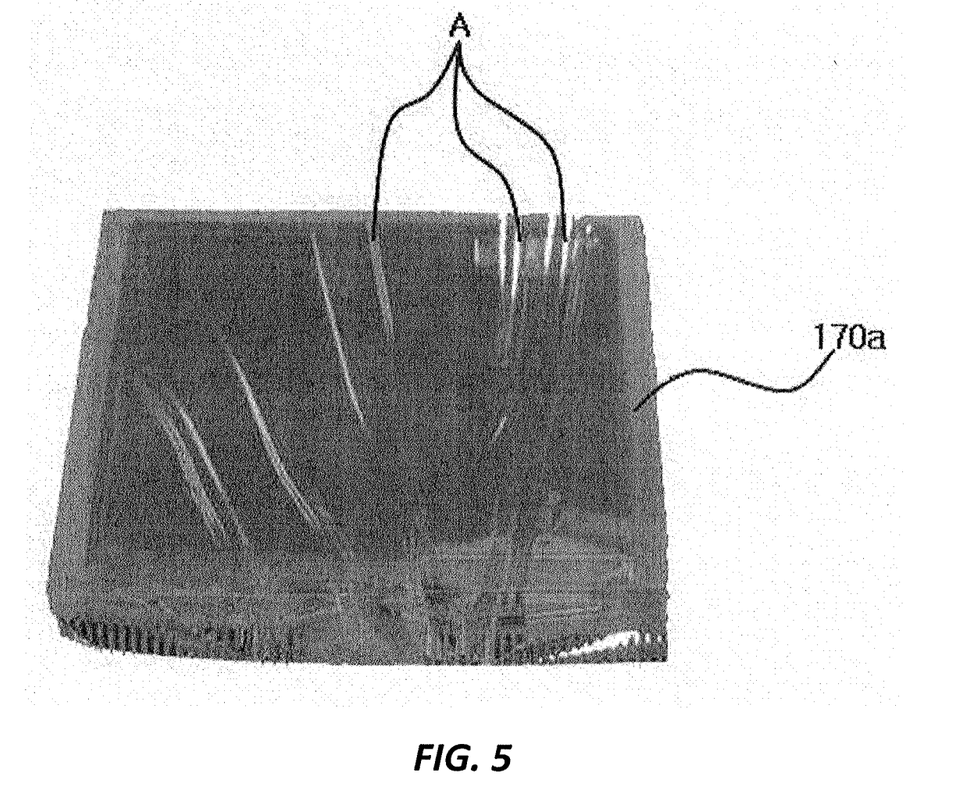
FIG. 5 is a view showing a flexible organic light emitting diode having a typical protecting film on an organic electroluminescent diode.
Figure 6:
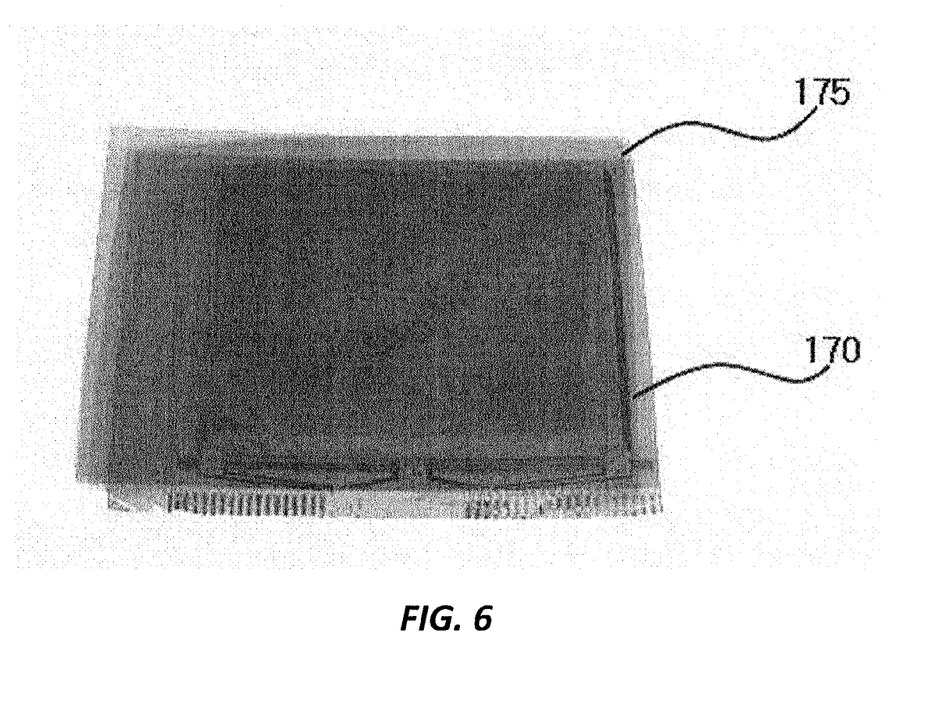
FIG. 6 is a view showing a flexible organic light emitting diode having first and second films on an organic electroluminescent diode according to an embodiment of the present invention.

FIG. 5 is a view showing a flexible organic light emitting diode having a typical protecting film on an organic electroluminescent diode and FIG. 6 is a view showing a flexible organic light emitting diode having first and second films on an organic electroluminescent diode according to an embodiment of the present invention.

In FIG. 5, when the typical protecting film 170a having an adhesion force of about 0.3 times to about 0.6 times of the reference adhesion force is attached to the organic EL diode, the typical protecting film 170a is pushed while a plastic substrate is detached from a carrier substrate. As a result, the typical protecting film 170a has a wrinkle and a bubble A is generated between the typical protecting film 170a and the organic EL diode.

In FIG. 6, when a first film 170 having a first adhesion force of about 0.9 times to about 1.1 times of the reference adhesion force and a second film 175 having a second adhesion force of about 3 times to about 5 times of the reference adhesion force are attached to the organic EL diode, the first and second films 170 and 175 are not pushed even while the a plastic substrate is detached from a carrier substrate. As a result, detachment of layers of the organic EL diode and generation of a bubble are prevented.

Further, since the process time for detaching the plastic substrate 110 from the carrier substrate 105 using the first and second substrates 170 and 175 is about 1 second to about 20 seconds, the process time of the present invention is reduced as compared with the process time of the related art using irradiation of the laser beam. As a result, fabrication productivity is improved.

Although the flexible OLED display device is exemplary illustrated as a display device having the first and second films according to the present invention, the first and second films may be applied to the flexible other display device that is fabricated using the carrier substrate and the plastic substrate. For example, a flexible LCD device or a flexible electrophoretic display (EPD) device may be fabricated by forming the first and second films on the plastic substrate attached to carrier substrate and by detaching the plastic substrate from the carrier substrate without irradiation of the laser beam.

Consequently, in a method of fabricating a flexible display device, since the plastic substrate is detached from the carrier substrate without irradiation of the laser beam, the laser apparatus of a high price is not required and fabrication cost is reduced. In addition, since deterioration due to irradiation of the laser beam such as degradation of the TFT property and electrical shortage of conductive lines, production yield is improved. Further, since the plastic substrate is detached from the carrier substrate within several seconds, process time is reduced and productivity is improved. Moreover, since the plastic substrate is not detached from the carrier substrate before the separation step of the plastic substrate and the carrier substrate due to the adhesion reinforcing layer, misalignment due to the detachment of the plastic substrate is prevented while the FPCB is attached to the gate pad and the data pad.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of fabricating a flexible display device, comprising:
   forming a plastic substrate on a carrier substrate, the plastic substrate including an active area, and a non-active area surrounding the active area;
   forming an array element on the plastic substrate, the array element including a plurality of layers and having an average adhesion force among the plurality of layers;
   forming a first film on the array element, the first film having a first adhesion force;
   attaching a flexible printed circuit board to the plastic substrate;
   forming a second film on the first film, the second film having a second adhesion force greater than the first adhesion force; and
   detaching the plastic substrate from the carrier substrate.

2. The method according to claim 1, wherein the first film is formed to cover the active area and a portion of the non-active area.

3. The method according to claim 1, wherein the second film is formed to cover the first film and a portion of the flexible printed circuit board.

4. The method according to claim 1, wherein forming the plastic substrate comprises:
   coating a liquid plastic material on the carrier substrate; and
   curing the liquid plastic material through a heat treatment.

5. The method according to claim 1, wherein forming the plastic substrate comprises attaching a film type plastic sheet to the carrier substrate.

6. The method according to claim 1, wherein the first adhesion force is about 0.9 times to about 1.1 times of the average adhesion force.

7. The method according to claim 1, wherein the first film includes one of polyimide (PI), polystyrene (PS), polyethylene terephthalate (PET), polyethylene naphthalate (PEN) and polyether sulfone (PES).

8. The method according to claim 1, wherein the second adhesion force is greater than an adhesion force between the carrier substrate and the plastic substrate and is about 3 times to 5 times of the average adhesion force.

9. The method according to claim 1, wherein the second film includes a polarizing plate.

10. The method according to claim 1, wherein forming the array element comprises forming a switching thin film transistor, a driving thin film transistor and an organic electroluminescent diode.

11. The method according to claim 10, wherein forming the array element further comprises:
    forming a gate line, a data line and a power line, the gate line and the data line crossing each other, and the power line parallel to and spaced apart from the data line, wherein the switching thin film transistor is connected to the gate line and the data line, and wherein the driving thin film transistor is connected to the switching thin film transistor and the power line; and
    forming a passivation layer on the switching thin film transistor and the driving thin film transistor.

12. The method according to claim 11, wherein forming the organic electroluminescent diode comprises:
    forming a first electrode on the passivation layer, the first electrode connected to the driving thin film transistor;
    forming an organic emitting layer on the first electrode; and
    forming a second electrode on the organic emitting layer.

13. The method according to claim 12, wherein forming the organic electroluminescent diode further comprises forming a bank layer on the first electrode, and wherein the organic emitting layer has a multiple-layer structure including a hole injection layer, a hole transporting layer, an emitting material layer, an electron transporting layer, and an electron injection layer.

14. The method according to claim 1, comprising applying a force to the carrier substrate after one end of the second film outside the carrier substrate is fixed by one of a vacuum adsorption and a clamp to detach the plastic substrate from the carrier substrate.

15. The method according to claim 1, further comprising:
    forming an adhesion mitigating layer of an inorganic material on an entire surface of the carrier substrate; and
    forming an adhesion reinforcing layer of a metallic material on the adhesion mitigating layer, the adhesion reinforcing layer having one of a lattice shape and a rectangular ring shape surrounding the display area.

16. The method according to claim 15, wherein the carrier substrate includes a glass, wherein the adhesion mitigating layer includes one of silicon oxide ($SiO_2$) and silicon nitride (SiNx), and wherein the adhesion reinforcing layer includes one of molybdenum (Mo), molybdenum tungsten (MoW), molybdenum titanium (MoTi), aluminum (Al), aluminum neodymium (AlNd), copper (Cu), amorphous indium-tin-oxide (a-ITO) and indium-gallium-zinc-oxide (IGZO).

* * * * *